(12) United States Patent
Huang et al.

(10) Patent No.: US 7,582,913 B2
(45) Date of Patent: Sep. 1, 2009

(54) LENS AND LED USING THE LENS TO ACHIEVE HOMOGENEOUS ILLUMINATION

(75) Inventors: Tien-Fu Huang, Hsinchu (TW); Che-Wei Su, Hsinchu (TW); Kuo-Chang Hu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 141 days.

(21) Appl. No.: 11/196,254

(22) Filed: Aug. 4, 2005

(65) Prior Publication Data

US 2006/0138437 A1    Jun. 29, 2006

(30) Foreign Application Priority Data

Dec. 29, 2004    (TW) .............................. 93141245 A (51) Int. Cl.
  *H01L 29/06*    (2006.01)
(52) U.S. Cl. .................. 257/98; 257/E33.072; 362/307
(58) Field of Classification Search .................. 257/98, 257/E33.072; 362/307
  See application file for complete search history.

(56) References Cited

U.S. PATENT DOCUMENTS

| | | | | |
|---|---|---|---|---|
| 5,806,955 A * | 9/1998 | Parkyn et al. | ................ | 362/612 |
| 6,019,493 A * | 2/2000 | Kuo et al. | ................ | 362/335 |
| 6,679,621 B2 | 1/2004 | West et al. | | |
| 2003/0235050 A1 * | 12/2003 | West et al. | ................ | 362/327 |
| 2004/0070855 A1 * | 4/2004 | Benitez et al. | ............... | 359/858 |
| 2004/0228131 A1 * | 11/2004 | Minano et al. | ............... | 362/307 |
| 2005/0001537 A1 * | 1/2005 | West et al. | ................ | 313/500 |
| 2005/0145867 A1 | 7/2005 | Yau et al. | | |
| 2006/0076568 A1 * | 4/2006 | Keller et al. | ................... | 257/98 |

FOREIGN PATENT DOCUMENTS

| | | |
|---|---|---|
| EP | 1 641 052 | 3/2006 |
| EP | 1 653 254 | 5/2006 |

* cited by examiner

*Primary Examiner*—Thomas L Dickey
(74) *Attorney, Agent, or Firm*—Rabin & Berdo, P.C.

(57) ABSTRACT

A lens and an LED using the lens to achieve homogeneous illumination include a region. The region around the optical axis of a lens is designed to be concave and form a divergent surface. The upper surface of the lens is a continuous curved surface to diverge the high-intensity light emitted by the LED in the vicinity of the optical axis through refractions. Therefore, the LED can homogeneously illuminate a larger area.

9 Claims, 12 Drawing Sheets
(8 of 12 Drawing Sheet(s) Filed in Color)

FIG. 12B ic # LENS AND LED USING THE LENS TO ACHIEVE HOMOGENEOUS ILLUMINATION

BACKGROUND OF THE INVENTION

1. Field of Invention

The invention relates to a lens and a light-emitting diode (LED) using the lens for illumination systems and, in particular, to an LED with homogeneous illumination.

2. Related Art

Figure 1A:
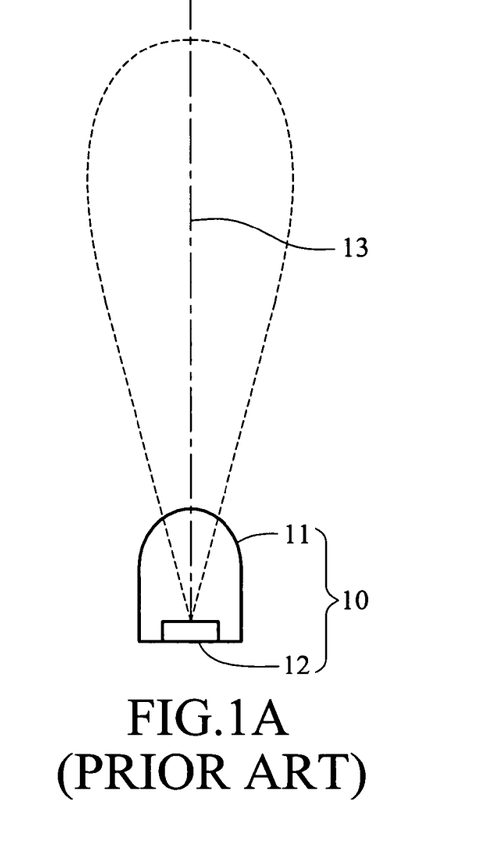
FIG. 1A is a schematic view of a conventional LED and its light-emitting style.
Figure 1B:
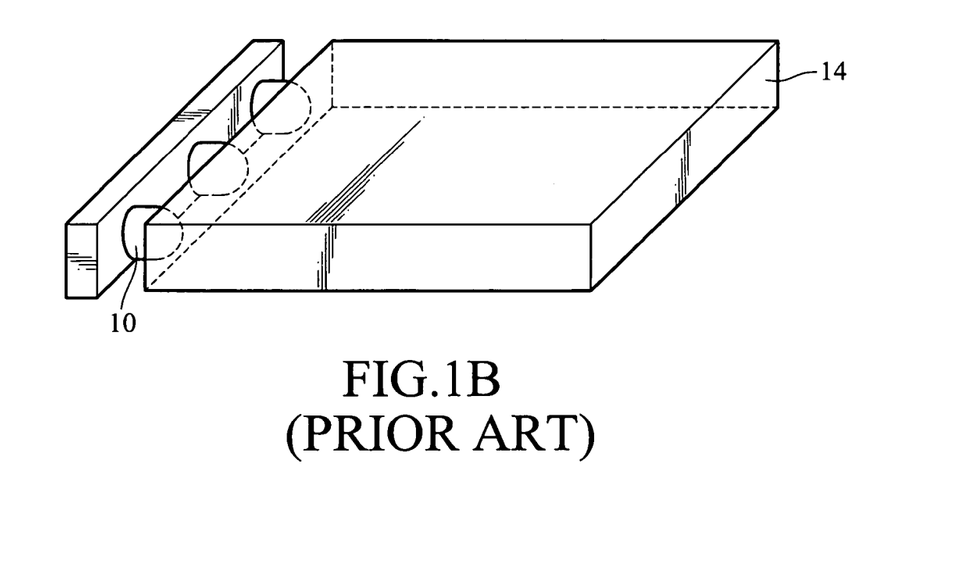
FIG. 1B is a schematic view of a conventional backlit module.

A traditional LED 10 is shown in FIG. 1A. It is formed by packing an LED chip 12 in a lens 11. The most commonly seen embodiment of the lens is illustrated in the drawing. The lens 11 is a hemisphere to converge the light emitted by the LED chip 12. The radiation pattern (directions and energy distribution of the emitted light) has to be restricted in the vicinity of the optical axis 13. Since the energy is more concentrated, one has to rely on the use of a light-guiding plate 14 to improve the homogeneity in the case of a surface plane light source. However, if the LED's 10 are directly distributed under the light-guiding plate, it requires a fair amount of LED's 10 because each one of them has a very small illuminating area. Therefore, one usually adopts the side-illuminating structure to achieve the required homogeneity of a surface plane light source, as shown in FIG. 1B. However, since the LED's 10 can provide the optical energy only at the edge of the light-guiding plate 14, the distance between the central part and the adjacent light sources becomes larger when the area of the surface plane light source is big. Therefore, the optical energy transmitted to the central part by virtue of total reflections become insufficient as the area enlarges. In other words, there is a certain limit for the area of the surface plane light source.

To overcome this problem, U.S. Pat. No. 6,679,621 uses a special lens shape to totally reflect the light coming out of the top surface of the LED and to deflect the light coming out of its side surfaces. All beams are emitted in parallel but orthogonal to the optical axis. Therefore, in the construction of a planar light surface, the LED's can be disposed in the middle of the light-guiding plate, instead of being limited to its edges. As the area of the surface plane light source gets larger, there will not be any problem of insufficient optical energy on the light-guiding plate due to the far distances to the light source. Nevertheless, the design relies on the total reflection and refraction of light. The overall light-emitting efficiency is lowered due to the attenuation of multiple reflections and refractions inside the light source system.

SUMMARY OF THE INVENTION

In view of the foregoing, an object of the invention is to provide a lens and a homogeneously illuminating LED using the lens. The invention can provide a large-area, homogeneous light-emitting surface. It can be directly used in a surface plane light source system. It further reduces the use of LED's to save the cost.

To achieve the above object, the disclosed lens and the LED that uses the lens have a lens designed on an action surface and in such a way that a concave divergent surface is formed around the optical axis. This design can deflect the light emitted in the vicinity of the optical axis away from the optical axis, so that the LED can provide a homogeneous and large-area light-emitting surface. According to a first embodiment, the invention includes a substrate, an LED chip, and a lens. The lens is bonded onto the substrate by packaging and covers the LED chip. The lens has a divergent surface around the optical axis and an adjacent convergent surface. The divergent surface diverges the light around the optical axis, and the convergent surface converges light of large angles toward the optical axis. Thus, the LED's can provide more homogeneous light in a larger area.

In a second embodiment of the invention, the lens is designed to have a concave part at its bottom and to be directly connected to the substrate. The concave part covers the LED chip.

In a third embodiment of the invention, the concave part at the bottom of the lens is designed to be the top surface of a conventional LED. The lens is directly installed on the conventional LED.

In a fourth embodiment, the lens is in the form of a Fresnel lens. Its equivalent lens is the same as before. However, the thickness of it is reduced to have more practical applications.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The invention will become more fully understood from the detailed description given hereinbelow illustration only, and thus are not limitative of the present invention, and wherein:

FIGS. 9A and 9B to 12A and 12B give the experimental data in our simulations.

DETAILED DESCRIPTION OF THE INVENTION

Figure 2:
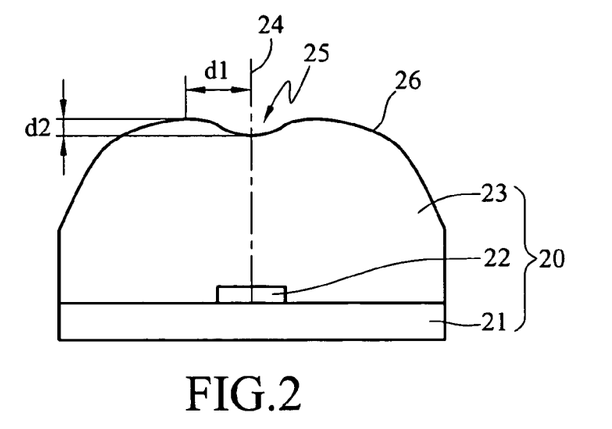
FIG. 2 is a schematic view of the disclosed LED according to the first embodiment of the invention.
Figure 3:
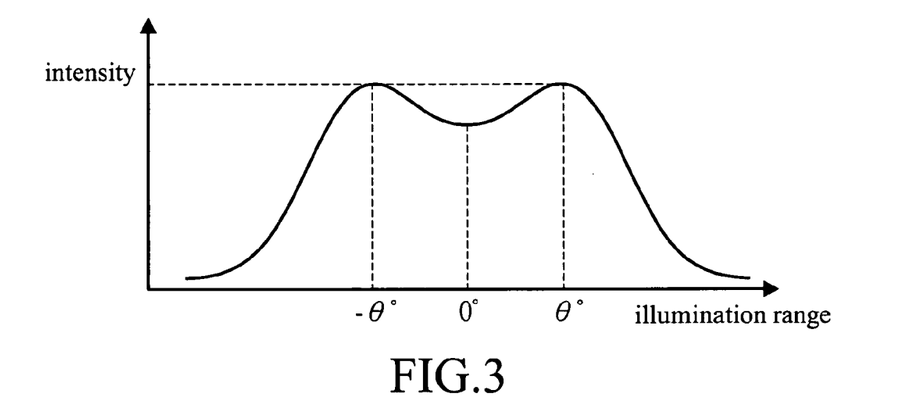
FIG. 3 is a light intensity distribution diagram of the disclosed LED.

In observation of the fact that the conventional LED usually has stronger light intensity around its optical axis, the disclosed lens and the LED using the disclosed lens diverge light in the vicinity of the optical axis. The first embodiment of the invention is shown in FIGS. 2 and 3. It contains a substrate 21, an LED chip 22, and a lens 23. The LED chip 22 is installed on the substrate 21 and has an optical axis 24. The lens 23 is connected to the substrate 21 by packaging to cover the LED chip 22. On the surface of the lens 23 and in the vicinity of the optical axis 24 is formed with a concave part as a divergent surface 25. The divergent surface 25 is surrounded by a convergent surface 26 with the optical axis 24 as a center. The divergent surface 25 is recessed towards the optical axis 24. The height difference from the divergent surface 25 to the bottom of the LED chip 22 increases from the optical axis outwards. The height difference from the convergent surface 26 to the bottom of the LED chip 22 decreases from the maximum outward. The upper action surface of the lens 23 is a continuous curved surface. The action surface referred herein means the surface above the lens 23 for the light emitted by the LED chip 22 to deflect. With this action surface, one is able to obtain a large-area and homogeneous beam of light. Therefore, the action surface does not necessarily mean the whole upper surface of the lens 23. It can be only a part of the upper surface. The size of the action surface is determined by the width and height of the lens 23, and type of the LED chip 22. The light emitted by the LED chip 22 and going through the divergent surface 25 is deflected away from the optical axis 24, whereas the light emitted by the LED chip 22 and going through the convergent surface 26 is deflected toward the optical axis 24. Therefore, the light intensity within a certain range becomes more homogeneous. The light intensity distribution is shown in FIG. 3. As one can see, the maximum intensity region is shifted outward away from the optical axis 24. The overall light-emitting region is larger and more homogeneous. In particular, the distance to the maximum light intensity region can be adjusted according to the distance d1 from the highest point on the surface of the lens 23 to the optical axis 24 and the height difference d2 from the lowest point of the divergent surface 25 to the highest point. A common design is that the lens 23 is a cylinder symmetric about the optical axis 24. Therefore, the intersection between the divergent surface 25 and the optical axis 24 is the lowest point. The distance d1 and the height difference d2 can be adjusted according to the refractive index, temperature coefficient, thickness, and height of the lens, the LED chip, and the desired homogeneous light-emitting area.

Figure 4:
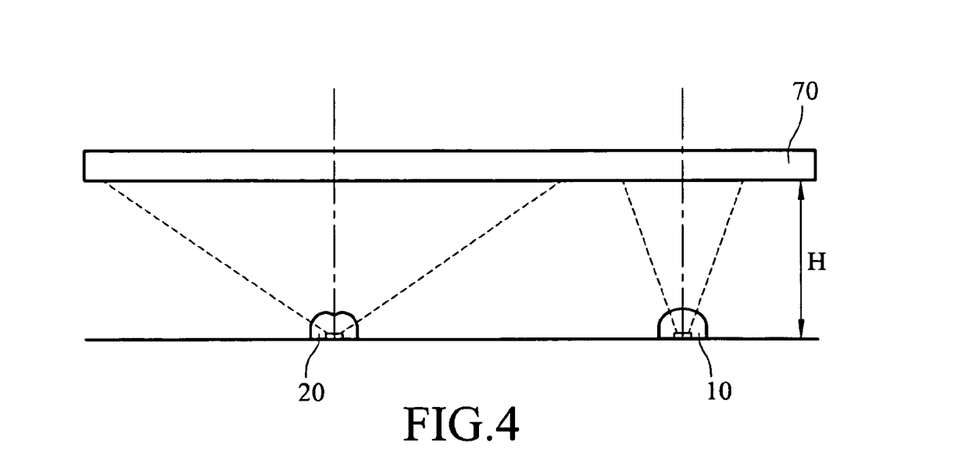
FIG. 4 compares the light-emitting area of the disclosed LED.

Since the divergent surface 25 is used to diverge the light near the optical axis 24, it is preferably to use a concave surface. However, it can be a mixture of concave and convex surfaces. The convergent surface 26 is used to converge light with large emission angles. Therefore, it is preferably to be a convex surface. As shown in FIG. 4, when projecting light on a screen 70 at a distance of H, the disclosed LED 20 has a larger and more homogeneous light-emitting range, in comparison with the conventional LED 10.

Figure 9A:
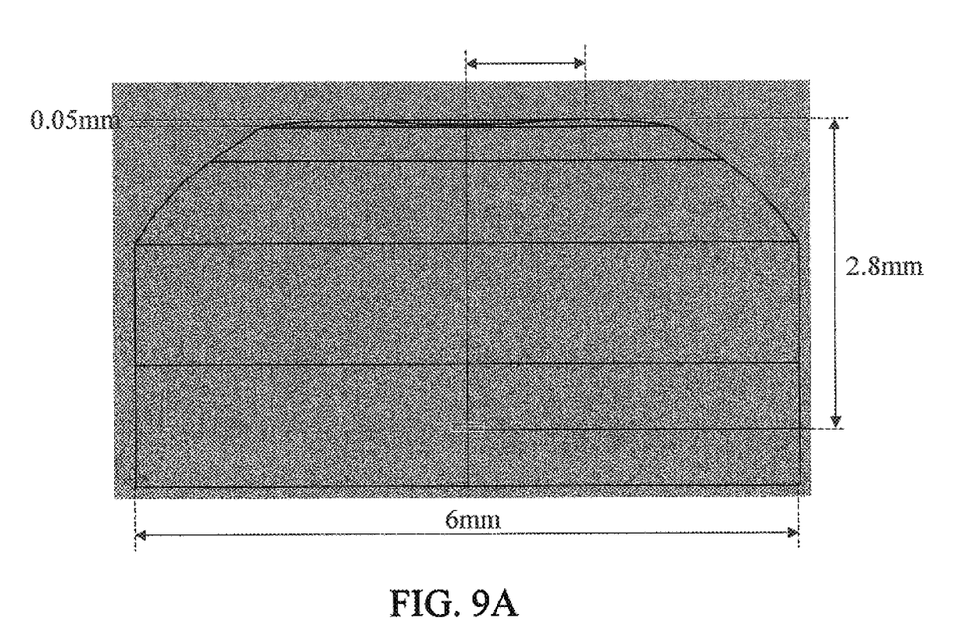
Figure 9B:
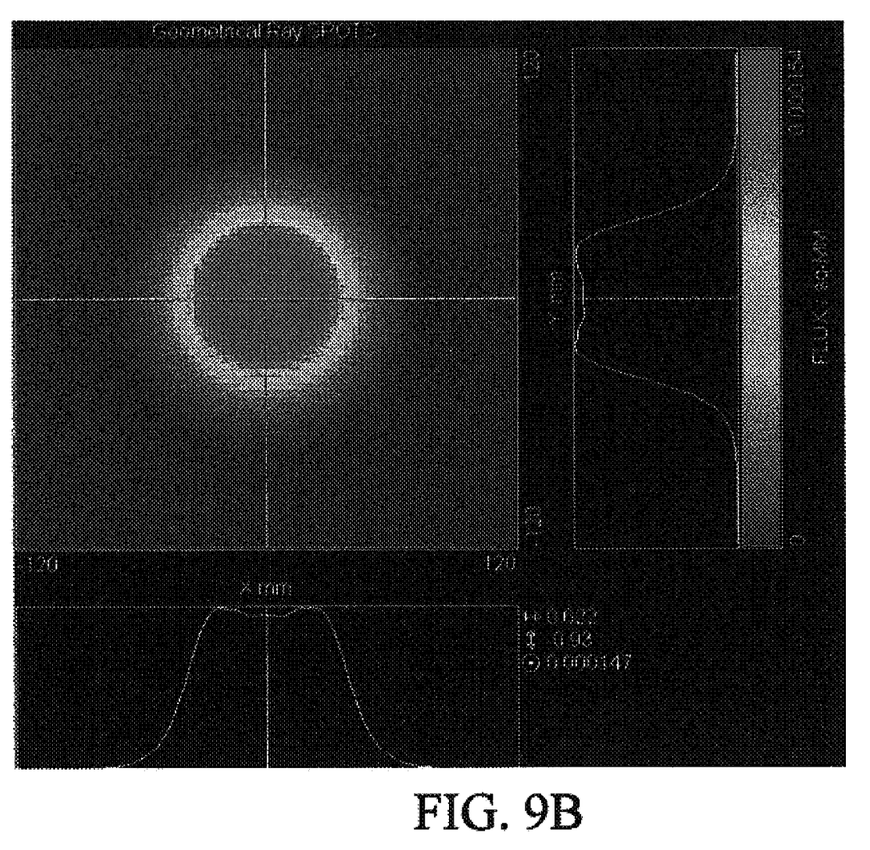
Figure 10A:
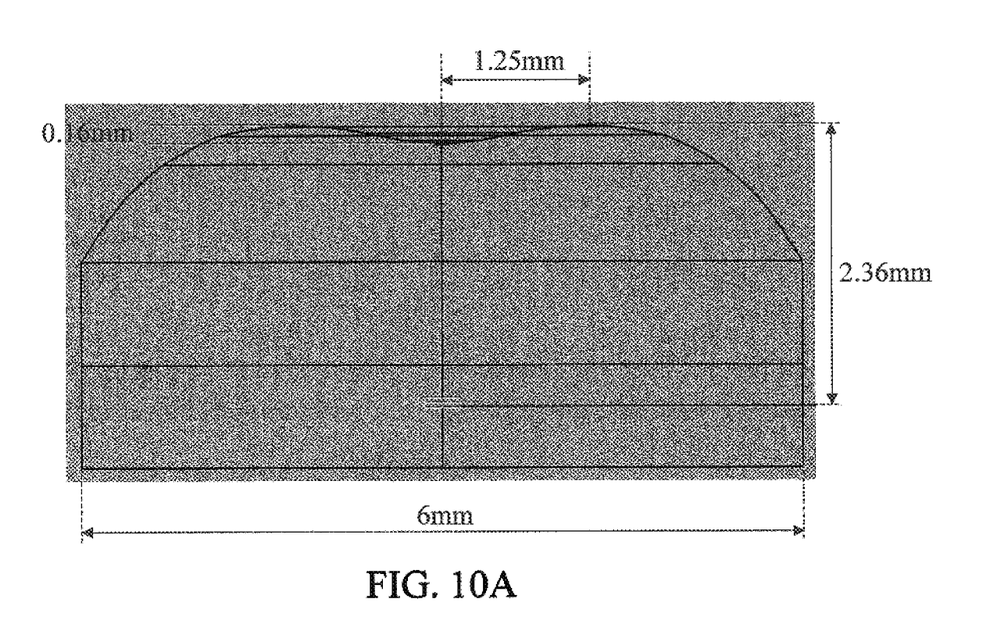
Figure 10B:
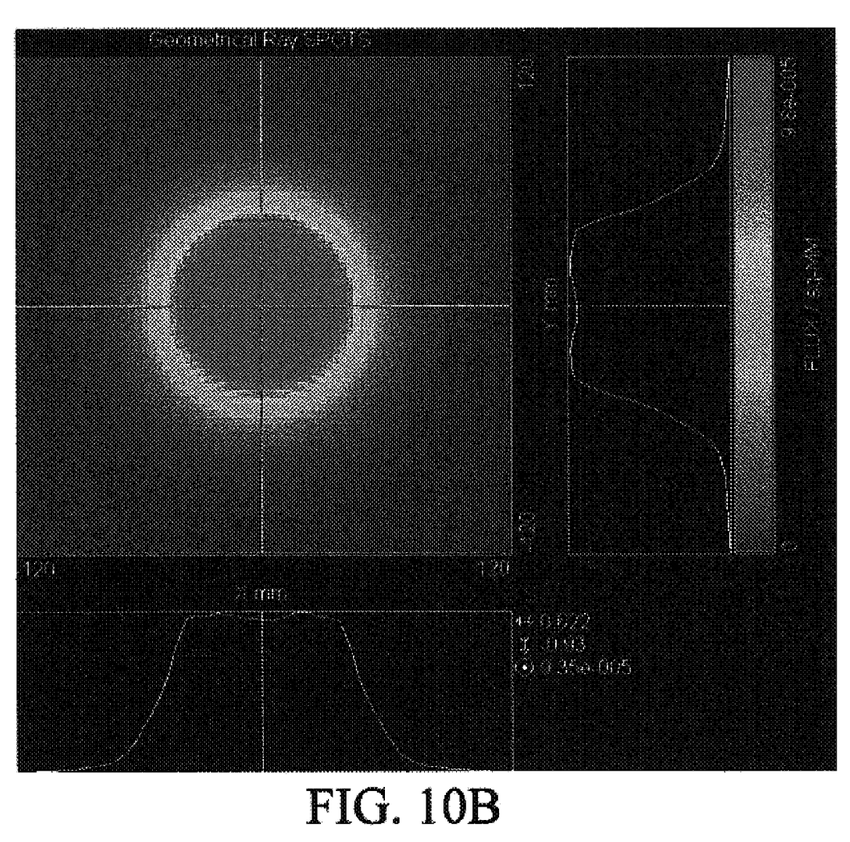
Figure 11A:
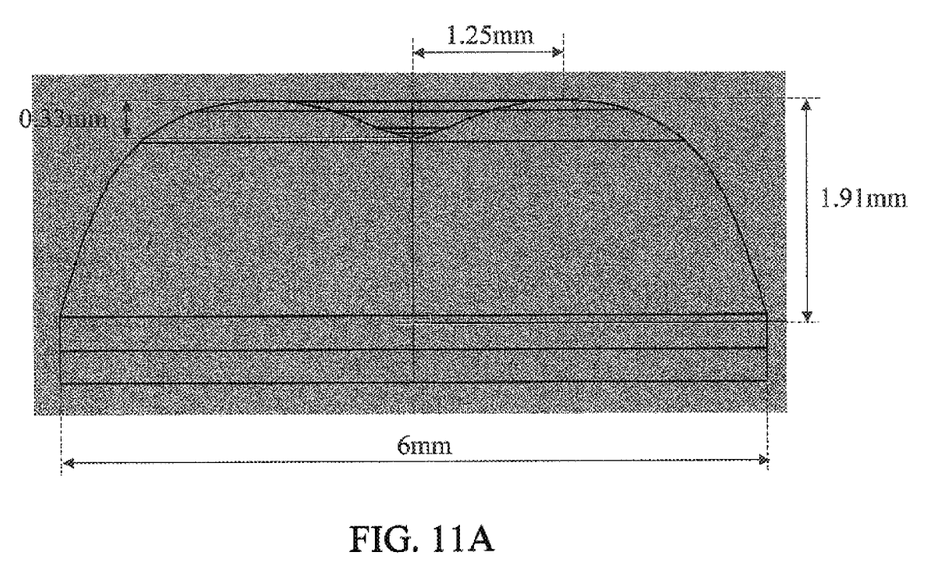
Figure 11B:
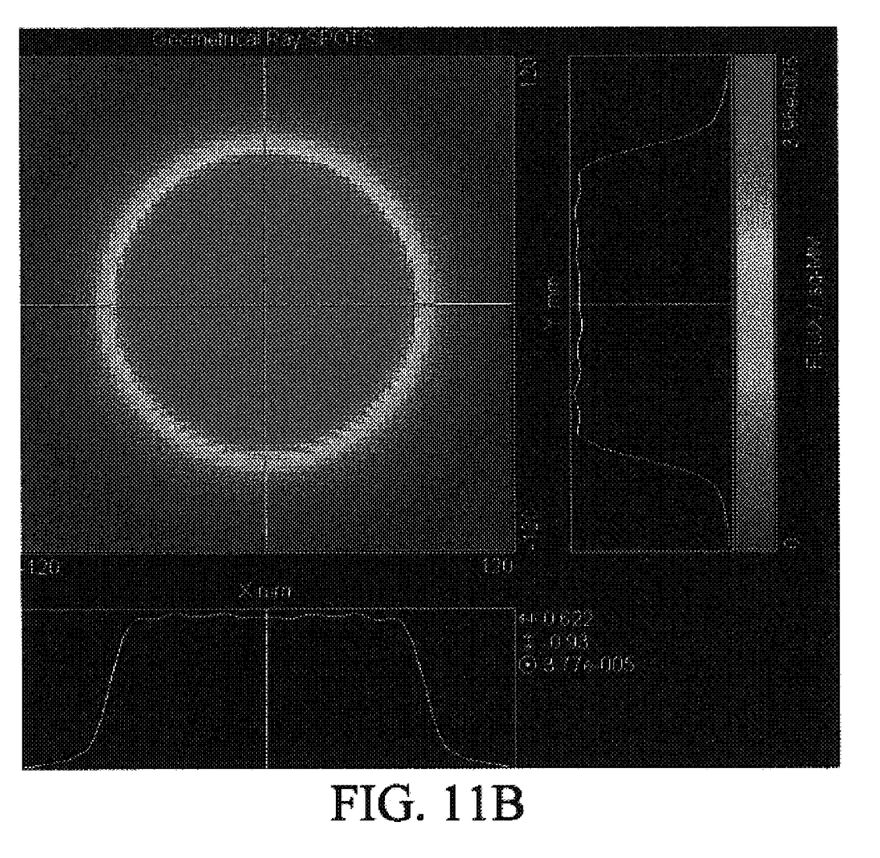
Figure 12A:
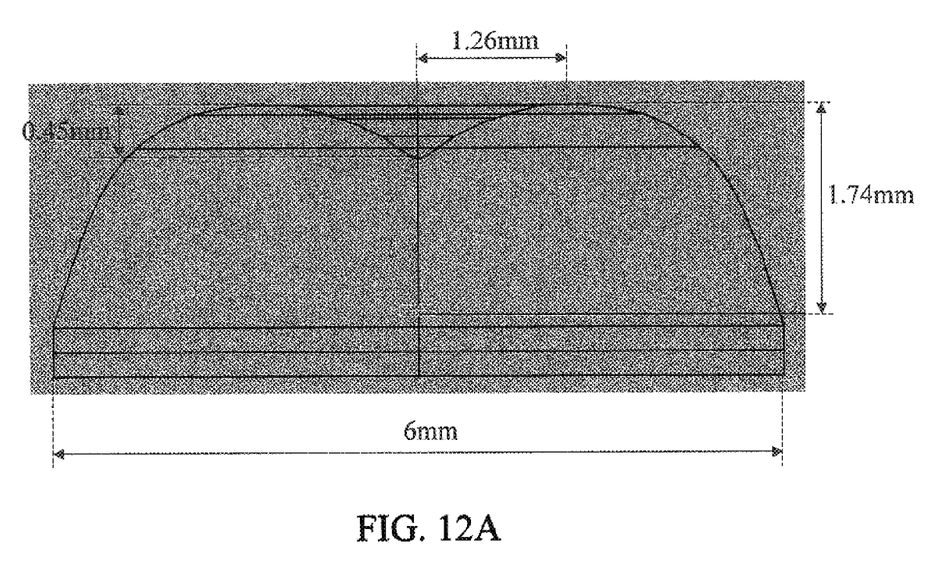
Figure 12B:
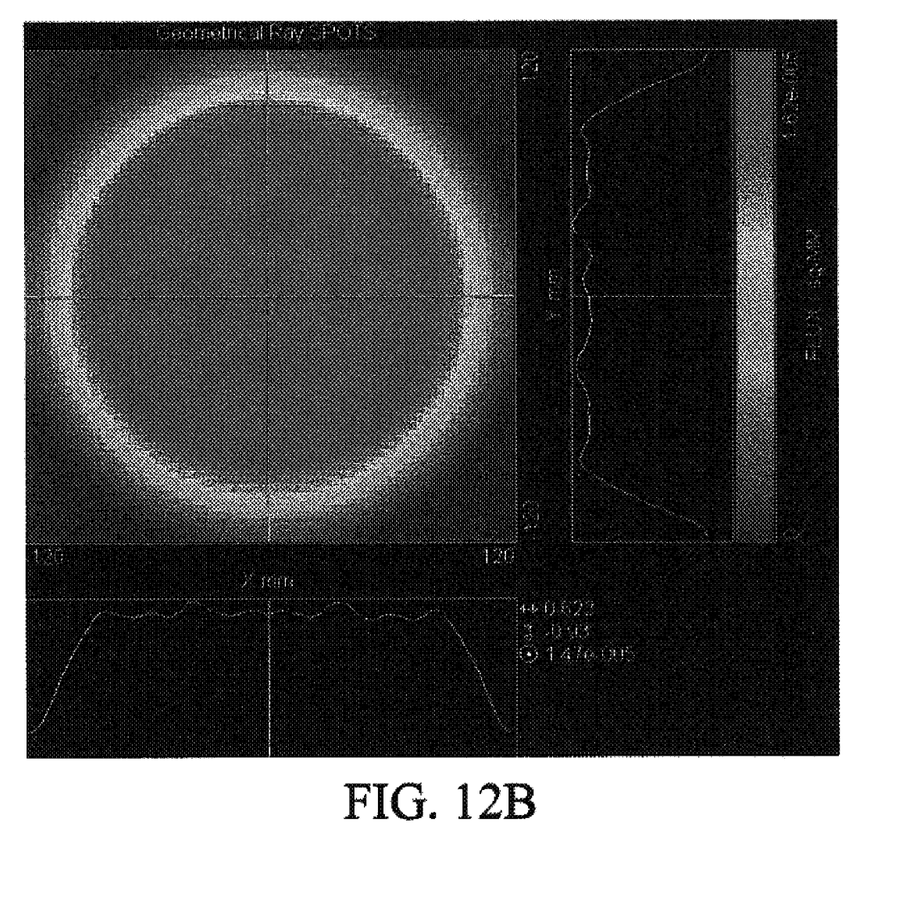

With reference to FIGS. 9A and 9B, one sees that the homogeneous light-emitting area is about 33 mm from the optical axis according to the first experimental data set. The LED chip has a distance of 30 mm. Therefore, we obtain a subtending angle of 47.7 degrees. Likewise, the subtending angle in FIGS. 10A and 10B is 53.8 degrees, that in FIGS. 11A and 11B is 67.4 degrees, and that in FIGS. 12A and 12B is 72.3 degrees. We therefore see that the subtending angle is enlarged to 45 to 75 degrees using the invention.

Please refer to FIGS. 9A and 9B again. The height difference (recession depth) d2 from the lowest point of the divergent surface 25 to the highest point is around 0.05 mm. The total height from the highest point to the bottom of LED chip 22 is around 2.8 mm. Therefore, the height ratio of recession depth to the total height is around 0.018 (0.05/2.8). As depicted above, the subtending angle in FIGS. 9A and 9B is 47.7 degrees.

Please refer to FIGS. 10A and 10B. The height difference (recession depth) d2 from the lowest point of the divergent surface 25 to the highest point is around 0.16 mm. The total height from the highest point to the bottom of LED chip 22 is around 2.36 mm. Therefore, the height ratio of recession depth to the total height is around 0.068 (0.16/2.36). As depicted above, the subtending angle in FIGS. 10A and 10B is 53.8 degrees.

Please refer to FIGS. 11A and 11B. The height difference (recession depth) d2 from the lowest point of the divergent surface 25 to the highest point is around 0.33 mm. The total height from the highest point to the bottom of LED chip 22 is around 1.91 mm. Therefore, the height ratio of recession depth to the total height is around 0.173 (0.33/1.91). As depicted above, the subtending angle in FIGS. 11A and 11B is 67.4 degrees.

Please refer to FIGS. 12A and 12B. The height difference (recession depth) d2 from the lowest point of the divergent surface 25 to the highest point is around 0.45 mm. The total height from the highest point to the bottom of LED chip 22 is around 1.74 mm. Therefore, the height ratio of recession depth to the total height is around 0.259 (0.45/1.74). As depicted above, the subtending angle in FIGS. 12A and 12B is 72.3 degrees.

In the embodiments in FIGS. 9A-12B, the height ratios are from 0.018 to 0.259. The recession depth varies from 0.05 mm to 0.45 mm when the total height varies from 2.8 mm to 1.74 mm. The subtending angles are from 47.7 to 72.3 degrees. A larger subtending angle provides a broader/larger uniform (homogeneous) flux of emitted light. To sum up, the higher the height ratio, the larger the subtending angle. In other words, in order to get a larger subtending angle, the height ratio should be designed higher.

Figure 5:
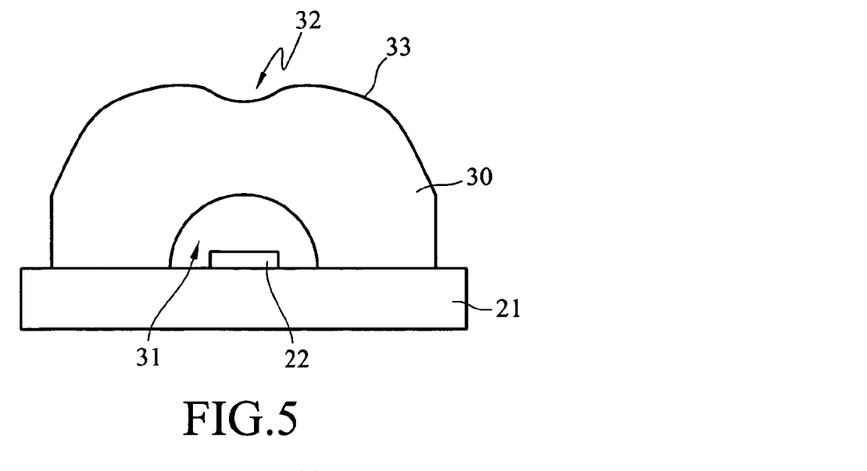
FIG. 5 is a schematic view of the disclosed LED according to the second embodiment of the invention.

On the other hand, the second embodiment of the invention is shown in FIG. 5. The lens 30 is designed to be a mask. Its surface also has a divergent surface 32 and a convergent surface 33. Its bottom has a concave part 31 that is greater than the LED chip 22. When the lens 30 is connected to the substrate 21, the concave part 31 covers the LED chip 22. A large-area homogeneous light-emitting area is also obtained.

Figure 6:
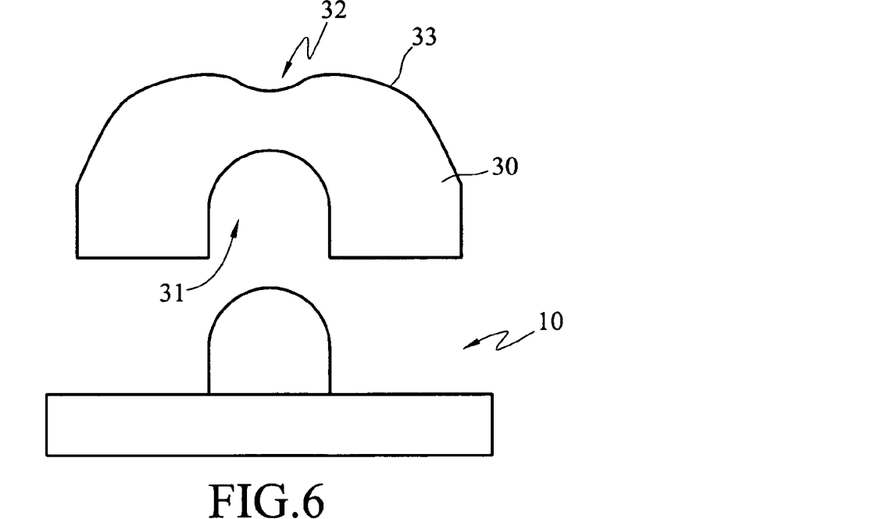
FIG. 6 is a schematic view of the disclosed LED according to the third embodiment of the invention.

A third embodiment of the invention is shown in FIG. 6. The concave part 31 is designed according to the shape of the LED 10 so that it can be directly combined with a conventional LED 10. This design is more convenient in use. However, the light-emitting efficiency is slightly lower due to the extra deflection.

Figure 7:
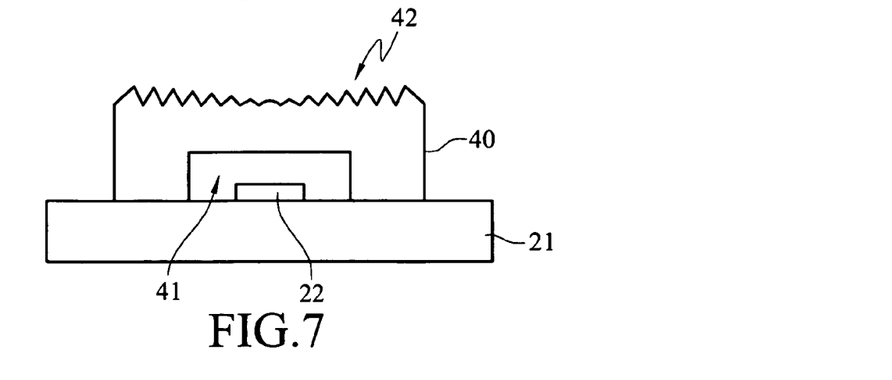
FIG. 7 is a schematic view of the disclosed LED according to the fourth embodiment of the invention.

A fourth embodiment is shown in FIG. 7. The surface of the lens 40 has the form of a Fresnel lens 42. The bottom also has a concave part 41 for accommodating an LED chip 22. The equivalent lens of the Fresnel lens-like surface 42 is the same as the above-mentioned lens 23 (see FIG. 2). This design can reduce the thickness of the LED and allow wider applications.

Figure 8:
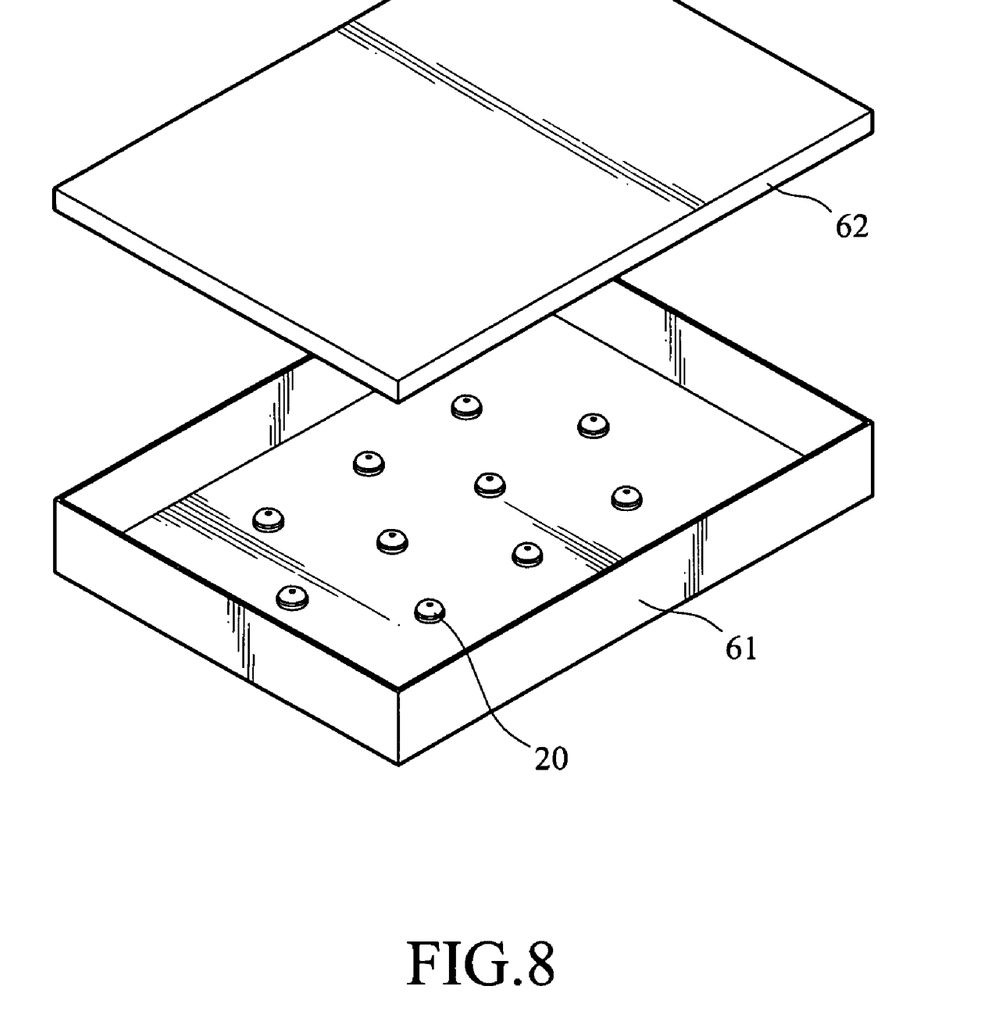
FIG. 8 shows an application of the invention.

As shown in FIG. 8, pluralities of LED's 20 are distributed on the frame 61 of a backlit module. A diffusive plate 62 is combined from the top. This can be used in a backlit module because the LED's 20 have better homogeneity and light-emitting range. In comparison with the prior art, the required number of LED's 20 for a backlit module of the same thickness can be reduced. In this case, it is less likely to have focused light spots.

Certain variations would be apparent to those skilled in the art, which variations are considered within the spirit and scope of the claimed invention.

What is claimed is:

1. A light-emitting diode (LED) that provides high intensity, homogeneous illumination, the LED comprising, in combination:
   a single light-emitting diode chip having a light emitting region and an optical axis; and
   a single lens that directly contacts and covers at least the light emitting region of the light-emitting diode chip
   wherein the lens has a structure that is circularly symmetrical and an action surface from which light is emitted that is a continuously curved surface including a concave portion provided in the vicinity of the optical axis of the light-emitting diode chip and defined as a divergent surface surrounded by a convergent surface in which the divergent surface and the bottom of the light-emitting diode chip have a height difference which increases outwardly, and the convergent surface and the bottom of the light-emitting diode chip have a height difference which decreases outwardly so that light emitted from the light-emitting diode chip is deflected away from the optical axis thereof as it goes through the divergent surface and is deflected toward the optical axis as it goes through the convergent surface, and so that the light-emitting region emits light through the single lens at a subtended angle ranging from 45 to 75 degrees whereby the light-emitting diode provides homogeneous illumination at an intensity ranging from 90% to 100% of that of the light-emitting diode chip alone.

2. The LED of claim 1, wherein the divergent surface has a lowest point which is at the intersection of the optical axis and the divergent surface.

3. The LED of claim 1, wherein the divergent surface is a combination of curved and anti-curved surfaces.

4. The LED of claim 1, wherein the convergent surface is a convex surface.

5. The LED of claim 1, wherein the LED has a recession depth which is 0.05 mm and a total height which is 2.8 mm.

6. The LED of claim 1, wherein the LED has a recession depth which is 0.16 mm and a total height which is 2.36 mm.

7. The LED of claim 1, wherein the LED has a recession depth which is 0.33 mm and a total height which is 1.91 mm.

8. The LED of claim 1, wherein the LED has a recession depth which is 0.45 mm and a total height which is 1.47 mm.

9. The LED of claim 1, wherein the LED has a recession depth which varies from 0.05 mm to 0.45 mm when total height thereof varies from 2.8 mm to 1.74 mm, the recession depth being the height difference from the lowest point to the highest point of the divergent surface, and the total height being the height difference from the highest point to the bottom of the light-emitting diode chip.

* * * * *